United States Patent [19]
Grabmaier et al.

[11] Patent Number: 4,643,797
[45] Date of Patent: Feb. 17, 1987

[54] METHOD FOR THE MANUFACTURE OF LARGE AREA SILICON CRYSTAL BODIES FOR SOLAR CELLS

[75] Inventors: Christa Grabmaier, Berg; Josef Kotschy, Unterhaching; August Lerchenberger, Munich, all of Fed. Rep. of Germany

[73] Assignee: Siemens Aktiengesellschaft, Berlin and Munich, Fed. Rep. of Germany

[21] Appl. No.: 759,243

[22] Filed: Jul. 26, 1985

[30] Foreign Application Priority Data

Aug. 28, 1984 [DE] Fed. Rep. of Germany ....... 3431592

[51] Int. Cl.$^4$ ............................................. C01B 31/36
[52] U.S. Cl. ......................... 156/603; 65/24; 156/DIG. 64; 156/DIG. 88; 264/61
[58] Field of Search ........... 65/24; 156/603, DIG. 64, 156/DIG. 88; 264/61

[56] References Cited

U.S. PATENT DOCUMENTS 3,863,325 2/1975 Gurganus et al. ................. 65/24 X
3,993,533 11/1976 Milnes et al. ............... 156/DIG. 88
4,305,776 12/1981 Grabmaier .......................... 156/605
4,330,358 5/1982 Grabmaier et al. ................. 156/603

FOREIGN PATENT DOCUMENTS 3017914 11/1981 Fed. Rep. of Germany .

Primary Examiner—Arthur Kellogg
Attorney, Agent, or Firm—Hill, Van Santen, Steadman & Simpson

[57] ABSTRACT

Recrystallized silicon plates are readily removed from a carrier member after melting and recrystallization, the carrier member being composed of a material that is not appreciably wettable by molten silicon, through the use of a parting agent between the silicon and the carrier in solid form as a powder or a raw foil. Fine quartz sand, very fine grained silicon powder, or quartz glass fiber fabric can be employed as the parting agent. The method is employed for the inexpensive manufacture of self-supporting silicon crystal plates for solar cells and allows throughput drawing rates of greater than 1 m$^2$/min.

12 Claims, 2 Drawing Figures

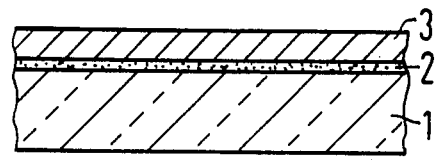
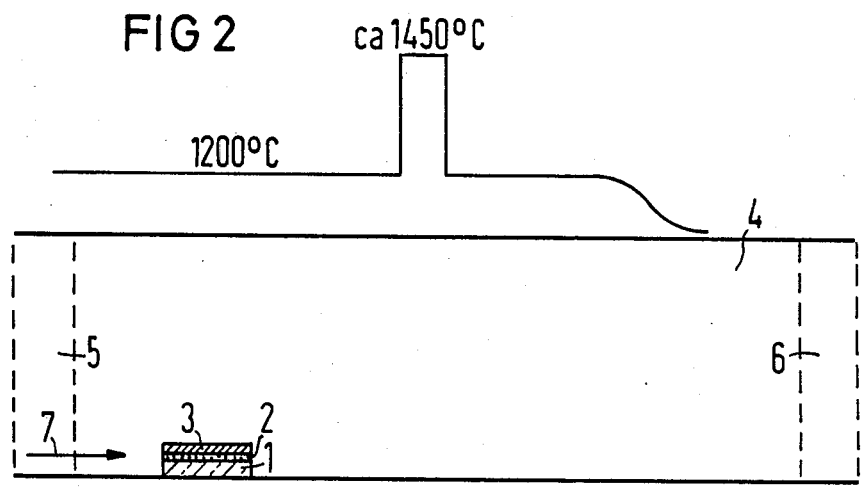

METHOD FOR THE MANUFACTURE OF LARGE AREA SILICON CRYSTAL BODIES FOR SOLAR CELLS

BACKGROUND OF THE INVENTION

1. Field of the Invention

This invention is in the field of continuously processing silicon to melt and recrystallize the same on an assembly line basis, utilizing a parting agent which significantly prevents sticking the recrystallized silicon to the carrier.

2. Description of the Prior Art

One method for the manufacture of large area silicon crystal bodies for use as solar cells employing assembly line techniques includes the steps of placing the silicon source in solid form on a carrier member, passing the same through a furnace for melting and subsequent recrystallization, the carrier member being not appreciably wettable by the molten silicon, and then removing the carrier member from the large area silicon crystal body after recrystallization.

German OS No. 28 50 805 (U.S. Pat. No. 4,305,776) discloses a method for the manufacture of plate-shaped silicon crystal bodies in a continuous, assembly line operation wherein a carrier member composed graphite is provided with holes at periodic intervals. This carrier member is brought into contact with the silicon melt and the molten silicon is crystallized on the carrier member. A graphite net with an appropriate mesh size is preferably employed, and is integrated into the silicon crystal body which forms after crystallization.

A further cost-improved method for the manufacture of plate-shaped silicon bodies for solar cells is described in German OS No. 29 27 086. The initial starting material is a silicon powder from which a foil is produced, cut to appropriate length, and then processed into self-supporting silicon plates by means of sintering at 1350° to 1400° C.

In a further development, described in German OS No. 30 17 914, quartz stock or quartz sand is employed as the sintering support, preferably as a plate-pressed bulk fill.

An improvement on this method is described in German Patent Application No. 33 05 933 wherein the sintered plates are melted in a horizontal heater arrangement, the silicon being melted on a carrier member composed of a net-like graphite fabric and having similar dimensions.

The problem occurring in some of the aforementioned prior art is that, due to the incorporation of a graphite net into the silicon, impurities that are present in the carrier member can be diffused into the silicon crystal lattice and deteriorate the crystal quality as well as the electrical properties of the solar cells fabricated of this material.

In order to prevent this, German Patent Application No. P 33 38 335 proposed that the silicon sintered bodies be caused to melt and crystallize in a horizontal heater arrangement on a carrier member which is not appreciably wettable by molten silicon, the carrier being predominantly composed of a quartz glass fiber fabric which is removed after the crystallization.

SUMMARY OF THE INVENTION

The present invention relates to the manufacture of self-supporting silicon crystal bodies which is not only carried out in a cost-beneficial manner with an assembly line procedure but wherein process steps can be eliminated in comparison to previous methods without disadvantage in terms of quality of the final product.

The present invention involves a method of the type described wherein, before the application of the initial silicon source material forming the large area silicon crystal body on the carrier, the carrier member is provided with a parting agent composed predominantly of quartz or silicon which in turn is removed from the silicon crystal body after the body has been recrystallized. In a preferred form of the invention, we employ fine silicon powder having a grain size of less than 10 microns as the parting material, and employ silicon powder having a grain size between 300 and 150 microns as the initial source material for the silicon crystal bodies.

In a preferred specific embodiment of the invention, the fine silicon powder is first applied as a thin layer having a thickness of less than 50 microns, and preferably in a layer thickness of about 20 microns, and a coarse silicon powder forming the silicon crystal body is subsequently applied in a thickness in the range from 400 to 600 microns, preferably about 500 microns. Both layers are applied to carrier plates which are composed, for example, of quartz glass or a heat-resistant ceramic. The thin parting layer prevents adhesion of the recrystallized layer of coarse silicon powder to the support. The fine silicon powder agglomerates as a porous silicon layer to the pore-free, recrystallized, self-supporting silicon crystal plate and can easily be removed after recrystallization by means of mechanically brushing it off or by means of etching in an alkali such as a potassium hydroxide solution.

In a further development of the invention, we may employ a quartz glass fiber fabric, a quartz powder, or fine grained quartz sand as the parting agent instead of the fine silicon powder. Also, in another embodiment, the silicon source may take the form of raw silicon plates composed of foils manufactured in accordance with the method disclosed by German OS No. 29 27 086. No organic binder is used in the foil or plate when the silicon powder, rendered workable with water, is immediately applied to the support composed preferably of a quartz fabric. The raw foils are drawn from coarse silicon powder having a grain size in the range from 30 to 150 microns. This grain size is particularly well suited because pore-free silicon crystal bodies having grains larger than 100 microns are obtained with these foils or plates in the recrystallization.

In accordance with the invention, the temperature treatment occurs in a throughput furnace having different heating zones for recrystallization. Supplying the heat necessary for melting the silicon from above is particularly advantageous.

Due to the simplicity of the method steps, and the fact that the recrystallization process is not dependent on the elimination of released crystallization heat, an area velocity of the silicon plates to be manufactured in excess of 1 m²/min can be achieved with the method according to the present invention.

BRIEF DESCRIPTION OF THE DRAWINGS

The method of the invention will be described more completely with reference to a preferred embodiment shown in the drawings in which:

FIG. 1 is a fragmentary cross-sectional view on an enlarged scale illustrating the carrier member provided with the parting layer and the initial silicon source material which forms the silicon crystal body; and FIG. 2 is a schematic illustration of the temperature profile of the horizontal heating furnace which is used in accordance with the present invention.

DESCRIPTION OF THE PREFERRED EMBODIMENTS

In FIG. 1, reference numeral 1 indicates a carrier material or support composed, for example, of heat-resistant ceramic material. The support 1 is covered by a layer 2 of parting material which may be about 20 microns in thickness and composed, for example, of finely powdered silicon. A layer 3 comprises the coarse grained silicon powder of which the self-supporting silicon crystal body is to be formed. The layer 3 can also be composed of silicon in foil form. The parting layer 2 can be composed of quartz glass fiber fabric or quartz sand.

Referring to FIG. 2, reference numeral 4 indicates the interior space of a horizontal furnace system which is closed at both ends by means of sealing locks 5 and 6. Arrow 7 indicates the direction of movement of the combination of carrier member, parting layer and silicon source through the furnace. The movement is initiated by an impact mechanism in the throughput operation in accordance with continuous assembly line operation. The furnace system is operated with a basic temperature of approximately 1200° C. which is maintained until the center of the furnace is reached. As shown in the temperature profile of FIG. 2, the temperature is then raised to the range of 1430° to 1480° C. in the center of the furnace (equal to the recrystallization temperature) before the cooling phase begins. The coarse grained silicon 3 which, for example, consists of a raw foil having a 50% density and a mean grain size of 50 microns in a layer thickness of 400 microns melts and fills the pores so that a silicon crystal body 200 microns in thickness with a density of 100% and a grain size greater than 100 microns exists at the end of the process. The speed is determined by the rate of transport of molten silicon between the grains. This, in turn, is dependent on the grain size, the size of the voids, the flow behavior, and the surface tension.

After removal from the furnace, the crystallized silicon body may be removed from the parting layer by mechanical means such as brushing or abrading, or by etching with an alkali such as a solution of potassium hydroxide.

It should be evident that various modifications can be made to the described embodiments without departing from the scope of the present invention.

We claim as our invention:

1. A method for the manufacture of large area silicon crystal bodies on an assembly line basis which comprises:
   providing a carrier member which is not appreciably wet by molten silicon,
   applying a parting agent consisting predominantly of very finely divided silicon powder on said carrier member,
   placing a crystalline silicon source in solid form and of much larger grain size than said parting agent on said parting agent,
   melting the crystalline source while supported on said parting agent and carrier,
   cooling the molten silicon below its recrystallization temperature, and
   removing the parting agent from the recrystallized silicon.

2. A method according to claim 1 wherein said parting agent has a particle size of less than 10 microns, and said solid crystalline silicon source is silicon powder having a grain size between 30 and 150 microns.

3. A method according to claim 1 wherein said parting agent has a thickness of less than 50 microns.

4. A method according to claim 3 wherein said parting agent has a thickness of about 20 microns.

5. A method according to claim 1 wherein said silicon source is silicon powder in a layer ranging from 400 to 600 microns in thickness.

6. A method according to claim 5 wherein said silicon powder is present as a layer of about 500 microns in thickness.

7. A method according to claim 1 wherein said silicon source is initially in the form of a raw silicon foil containing no organic binder.

8. A method according to claim 1 wherein said carrier comprises a heat-resistant plate of quartz glass.

9. A method according to claim 1 wherein said carrier comprises a heat-resistant plate of ceramic.

10. A method according to claim 1 wherein the heat for melting said silicon source is applied predominantly from above.

11. A method according to claim 1 wherein said parting agent is removed from the recrystallized silicon body by brushing.

12. A method according to claim 1 wherein said parting agent is removed from the recrystallized silicon body by etching in an alkali solution.

* * * * *